(12) United States Patent
Koikegami et al.

(10) Patent No.: US 11,472,472 B2
(45) Date of Patent: Oct. 18, 2022

(54) POWER CONVERSION DEVICE, MOTOR MODULE, AND ELECTRIC POWER STEERING DEVICE

(71) Applicant: Nidec Corporation, Kyoto (JP)

(72) Inventors: Takashi Koikegami, Kawasaki (JP); Yuhi Nakada, Kyoto (JP); Kaori Nabeshi, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 372 days.

(21) Appl. No.: 16/637,288

(22) PCT Filed: Jun. 22, 2018

(86) PCT No.: PCT/JP2018/023733
§ 371 (c)(1),
(2) Date: Feb. 7, 2020

(87) PCT Pub. No.: WO2019/053992
PCT Pub. Date: Mar. 21, 2019

(65) Prior Publication Data
US 2020/0247464 A1    Aug. 6, 2020

(30) Foreign Application Priority Data
Sep. 13, 2017 (JP) .............................. JP2017-176130

(51) Int. Cl.
*H02P 27/06* (2006.01)
*H02P 27/08* (2006.01)
(Continued)

(52) U.S. Cl.
CPC ........... *B62D 5/0484* (2013.01); *B62D 5/046* (2013.01); *B62D 5/0487* (2013.01);
(Continued)

(58) Field of Classification Search
CPC ........ B62D 5/0487; B62D 5/046; B62D 5/04; B62D 6/00; B62D 5/0484; H02P 27/06;
(Continued)

(56) References Cited

U.S. PATENT DOCUMENTS 11,063,545 B2 * 7/2021 Koikegami ............. H02M 1/32
2013/0320903 A1   12/2013 Aalund et al.
(Continued)

FOREIGN PATENT DOCUMENTS

JP         2009-055657 A       3/2009
JP         2009055657 A  *    3/2009
(Continued)

OTHER PUBLICATIONS

Official Communication issued in International Patent Application No. PCT/JP2018/023733, dated Jul. 24, 2018.

*Primary Examiner* — Thai T Dinh
(74) *Attorney, Agent, or Firm* — Keating & Bennett

(57) ABSTRACT

A power conversion device includes a first inverter and a control circuit that controls an on/off operations of switches in the first inverter and diagnoses disconnection failures of n-phase windings, where n is an integer of three or more. The control circuit generates a control signal to turn off all of n low-side switches and n high-side switches, supplies the control signal to the n low-side switches and the n high-side switches and measures the n-phase voltages that change depending on patterns of on failures of the switches, and executes a first failure diagnosis to diagnose the on failures of the n low-side switches and the n high-side switches based on the measured n-phase voltages by referring to a table associating the patterns of the on failures of the switches with n-phase voltage levels.

12 Claims, 10 Drawing Sheets

(51) Int. Cl.

| | |
|---|---|
| *B62D 6/00* | (2006.01) |
| *H02M 7/537* | (2006.01) |
| *B62D 5/04* | (2006.01) |
| *G01R 31/327* | (2006.01) |
| *H02H 7/08* | (2006.01) |
| *H03K 17/082* | (2006.01) |

(52) U.S. Cl.
CPC ....... *G01R 31/3275* (2013.01); *H02H 7/0844* (2013.01); *H02M 7/537* (2013.01); *H02P 27/06* (2013.01); *H03K 17/0822* (2013.01)

(58) Field of Classification Search
CPC .... H02P 27/08; H02M 7/537; G01R 31/3275; H02H 7/0844
See application file for complete search history.

(56) References Cited

U.S. PATENT DOCUMENTS

| | | | |
|---|---|---|---|
| 2014/0139158 A1* | 5/2014 | Tomita | H02P 29/0243 318/400.21 |
| 2016/0111988 A1* | 4/2016 | Suzuki | B62D 5/046 180/446 |
| 2017/0282968 A1* | 10/2017 | Kezobo | H02P 27/06 |
| 2018/0175779 A1* | 6/2018 | Koseki | B62D 5/0484 |
| 2018/0208237 A1 | 7/2018 | Kumagai et al. | |

FOREIGN PATENT DOCUMENTS

| | | |
|---|---|---|
| JP | 2014-192950 A | 10/2014 |
| JP | 2015-089294 A | 5/2015 |
| JP | 2017-063571 A | 3/2017 |

* cited by examiner

| FAILURE DIAGNOSIS | ON/OFF PATTERN OF SWITCHING ELEMENT | | | | | | | | | | | | | MEASUREMENT | | | | | | | FAILURE DETECTION |
|---|---|---|---|---|---|---|---|---|---|---|---|---|---|---|---|---|---|---|---|---|---|
| | FIRST INVERTER | | | | | | SECOND INVERTER | | | | | | | PHASE VOLTAGE | | | | | | | |
| | FOR CUTOFF POWER SUPPLY | HIGH-SIDE | | | LOW-SIDE | | | FOR CUTOFF POWER SUPPLY | HIGH-SIDE | | | LOW-SIDE | | | FIRST INVERTER | | | SECOND INVERTER | | | |
| | GND | U | V | W | U | V | W | GND | U | V | W | U | V | W | Vu | Vv | Vw | Vu | Vv | Vw | |
| ON FAILURE OF SWITCHING ELEMENT | On | On | Off | Off | Off | Off | Off | Turn off all of inverter not to be diagnosed | | | | | | | M L/H | M | M | - | - | - | Pass (Normal) / On failure of first U phase (H or L) / On failure of first V phase (H or L) / On failure of first W phase (H or L) |
| | | | | | | | | | | | | | | | | L/H | | | | | |
| | | | | | | | | | | | | | | | | | L/H | | | | |
| | Turn off all of inverter not to be diagnosed | | | | | | | On | Off | Off | Off | Off | Off | Off | - | - | - | M L/H | M | M | Pass (Normal) / On failure of second U phase (H or L) / On failure of second V phase (H or L) / On failure of second W phase (H or L) |
| | | | | | | | | | | | | | | | | | | | L/H | | |
| | | | | | | | | | | | | | | | | | | | | L/H | |
| OFF FAILURE OF SWITCHING ELEMENT | On | On | Off | Off | On | On | On | Turn off all of inverter not to be diagnosed | | | | | | | L M | L | L | - | - | - | Pass (Normal) / Off failure of first U phase L / Off failure of first V phase L / Off failure of first W phase L |
| | | | | | | | | | | | | | | | | M | | | | | |
| | | | | | | | | | | | | | | | | | M | | | | |
| | On | On | On | On | Off | Off | Off | Turn off all of inverter not to be diagnosed | | | | | | | H M | H | H | - | - | - | Pass (Normal) / Off failure of first U phase H / Off failure of first V phase H / Off failure of first W phase H |
| | | | | | | | | | | | | | | | | M | | | | | |
| | | | | | | | | | | | | | | | | | M | | | | |
| | Turn off all of inverter not to be diagnosed | | | | | | | On | On | Off | Off | On | On | On | - | - | - | L M | L | L | Pass (Normal) / Off failure of second U phase L / Off failure of second V phase L / Off failure of second W phase L |
| | | | | | | | | | | | | | | | | | | | M | | |
| | | | | | | | | | | | | | | | | | | | | M | |
| | Turn off all of inverter not to be diagnosed | | | | | | | On | On | On | On | Off | Off | Off | - | - | - | H M | H | H | Pass (Normal) / Off failure of second U phase H / Off failure of second V phase H / Off failure of second W phase H |
| | | | | | | | | | | | | | | | | | | | M | | |
| | | | | | | | | | | | | | | | | | | | | M | |
| DISCONNECTION FAILURE OF WINDING | On | Off | Off | Off | On | Off | Off | Off | | | | | | | L L L L | L M M L | L L L M | - | - | - | Pass (Normal) / U phase disconnection / V phase disconnection / W phase disconnection |

Fig.4

| FAILURE DIAGNOSIS | ON/OFF PATTERN OF SWITCHING ELEMENT | | | | | | | | MEASUREMENT | | | | FAILURE DETECTION |
|---|---|---|---|---|---|---|---|---|---|---|---|---|---|
| | FOR CUTOFF POWER SUPPLY | FIRST INVERTER HIGH-SIDE | | | LOW-SIDE | | | | PHASE VOLTAGE FIRST INVERTER | | | | |
| | | U | V | W | U | V | W | | Vu | Vv | Vw | | |
| ON FAILURE OF SWITCHING ELEMENT | On | Off | Off | Off | Off | Off | Off | | M | M | M | | Pass (Normal) |
| | | | | | | | | | L/H | | | | On Failure of first U phase (H or L) |
| | | | | | | | | | | L/H | | | On Failure of first V phase (H or L) |
| | | | | | | | | | | | L/H | | On Failure of first W phase (H or L) |
| OFF FAILURE OF SWITCHING ELEMENT | On | Off | Off | Off | On | On | On | | L | L | L | | Pass (Normal) |
| | | | | | | | | | M | | | | Off failure of first U phase L |
| | | | | | | | | | | M | | | Off failure of first V phase L |
| | | | | | | | | | | | M | | Off failure of first W phase L |
| | On | On | On | On | Off | Off | Off | | H | H | H | | Pass (Normal) |
| | | | | | | | | | M | | | | Off failure of first U phase H |
| | | | | | | | | | | M | | | Off failure of first V phase H |
| | | | | | | | | | | | M | | Off failure of first W phase H |
| DISCONNECTION FAILURE OF WINDING | On | Off | Off | Off | On | Off | Off | | L | L | L | | Pass (Normal) |
| | | | | | | | | | L | M | M | | U phase disconnection (or Off failure of U phase relay) |
| | | | | | | | | | L | L | M | | V phase disconnection |
| | | | | | | | | | L | M | L | | W phase disconnection |
| | | | | | | | | | Other case | | | | Failure site is not identifiable |
| OFF FAILURE OF PHASE SEPARATION RELAY | On | On | Off | Off | Off | Off | Off | | H | H | H | | Pass (Energization path is normal) |
| | | | | | | | | | H | M | H | | Off failure of V phase relay |
| | | | | | | | | | H | H | M | | Off failure of W phase relay |
| | | | | | | | | | Other case | | | | Failure site is not identifiable |

Fig.9

POWER CONVERSION DEVICE, MOTOR MODULE, AND ELECTRIC POWER STEERING DEVICE

CROSS REFERENCE TO RELATED APPLICATIONS

This is a U.S. national stage of PCT Application No. PCT/JP2018/023733, filed on Jun. 22, 2018, and priority under 35 U.S.C. § 119(a) and 35 U.S.C. § 365(b) is claimed from Japanese Application No. 2017-176130, filed Sep. 13, 2017; the entire disclosures of each application being hereby incorporated herein by reference.

1. FIELD OF THE INVENTION

The present disclosure relates to a power conversion device, a motor module, and an electric power steering device that convert power from a power supply into power to be supplied to an electric motor.

2. BACKGROUND

In recent years, an electromechanically integrated motor in which an electric motor (hereinafter simply referred to as "motor") and an electrical control unit (ECU) are integrated has been developed. Particularly in the in-vehicle field, high quality assurance is required from the viewpoint of safety. Therefore, a redundant design has been adopted in which a safe operation can be continued even when some of parts fail. As an example of the redundant design, to provide two inverters for one motor has been studied. As another example, to provide a backup microcontroller in a main microcontroller has been studied.

There has been known a power conversion device that includes a control unit and two inverters and converts power from a power supply into power to be supplied to a three-phase motor. Each of the two inverters is connected to the power supply and ground (hereinafter referred to as "GND"). One of the inverters is connected to one ends of three-phase windings of the motor, and the other inverter is connected to the other ends of the three-phase windings. Each of the inverters has a bridge circuit constituted by three legs, each including a high-side switching element and a low-side switching element. When detecting a failure of the switching element in the two inverters, the control unit switches motor control from control in the normal case to control in the abnormal case. In the control in the normal case, for example, the motor is driven by switching the switching elements of the two inverters. In the control in the abnormal case, for example, the motor is driven by a non-failed inverter using a neutral point of the winding in a failed inverter.

In the device that drives the motor using the two inverters as described above, it is required to identify a failure point within as short a time as possible when a failure occurs in the inverter.

There has been known a device that drives a motor having Y-connected windings with a single inverter (hereinafter referred to as "single inverter device"). There has also been known a technique of collating a signal detected in a predetermined energization pattern with a predetermined abnormality type correspondence table to detect disconnection and a short circuit of the wiring.

In the above technique, however, when a failure occurs in a switching element included in the inverter, it is difficult to identify which switching element among a plurality of switching elements has failed. In addition, the failure detection such as the disconnection of the wiring is performed using measured current value and voltage value, and thus, more time is consumed for the failure detection and the identification of the failure point.

SUMMARY

A power conversion device according to an example embodiment of the present disclosure is a power conversion device that converts power from a power supply into power to be supplied to a motor having n-phase windings, where n is an integer of three or more, the power conversion device including a first inverter connected to first ends of the respective phase windings of the motor, the first inverter including n legs each of which includes a low-side switch and a high-side switch, and a control circuit that controls an on/off operation of the n low-side switches and the n high-side switches in the first inverter, and diagnoses on failures of the n low-side switches and the n high-side switches. The control circuit generates a control signal to turn off all the n low-side switches and the n high-side switches, supplies the control signal to the n low-side switches and the n high-side switches and measures n-phase voltages that change depending on a pattern of the on failure of the switch, and executes a first failure diagnosis to diagnose the on failures of the n low-side switches and the n high-side switches based on the measured n-phase voltages by referring to a table associating the pattern of the on failure of the switches with n-phase voltage levels.

The above and other elements, features, steps, characteristics and advantages of the present disclosure will become more apparent from the following detailed description of the example embodiments with reference to the attached drawings.

BRIEF DESCRIPTION OF THE DRAWINGS

FIG. 4 is a table illustrating contents of a look-up table associating various failure patterns with three-phase voltage levels according to the first example embodiment of the present disclosure.

FIG. 9 is a table illustrating contents of a look-up table associating various failure patterns with three-phase voltage levels according to the second example embodiment of the present disclosure.

DETAILED DESCRIPTION

Hereinafter, example embodiments of power conversion devices, motor modules, and electric power steering devices of the present disclosure will be described in detail with reference to the accompanying drawings. However, there is a case where a detailed description more than necessary is omitted in order to prevent the following description from being unnecessarily redundant and to facilitate understanding by those skilled in the art. For example, detailed descriptions of already well-known matters and repeated descriptions for substantially the same configuration are omitted in some cases.

In the present specification, example embodiments of the present disclosure will be described by taking, as an example, a power conversion device that converts power from a power supply into power to be supplied to a three-phase motor having three-phase (U-phase, V-phase, W-phase) windings. However, a power conversion device that converts power from a power supply into power to be supplied to an n-phase motor having n-phase winding (n is an integer of four or more), such as four-phase windings and five-phase windings, is also within the scope of the present disclosure.

Figure 1:
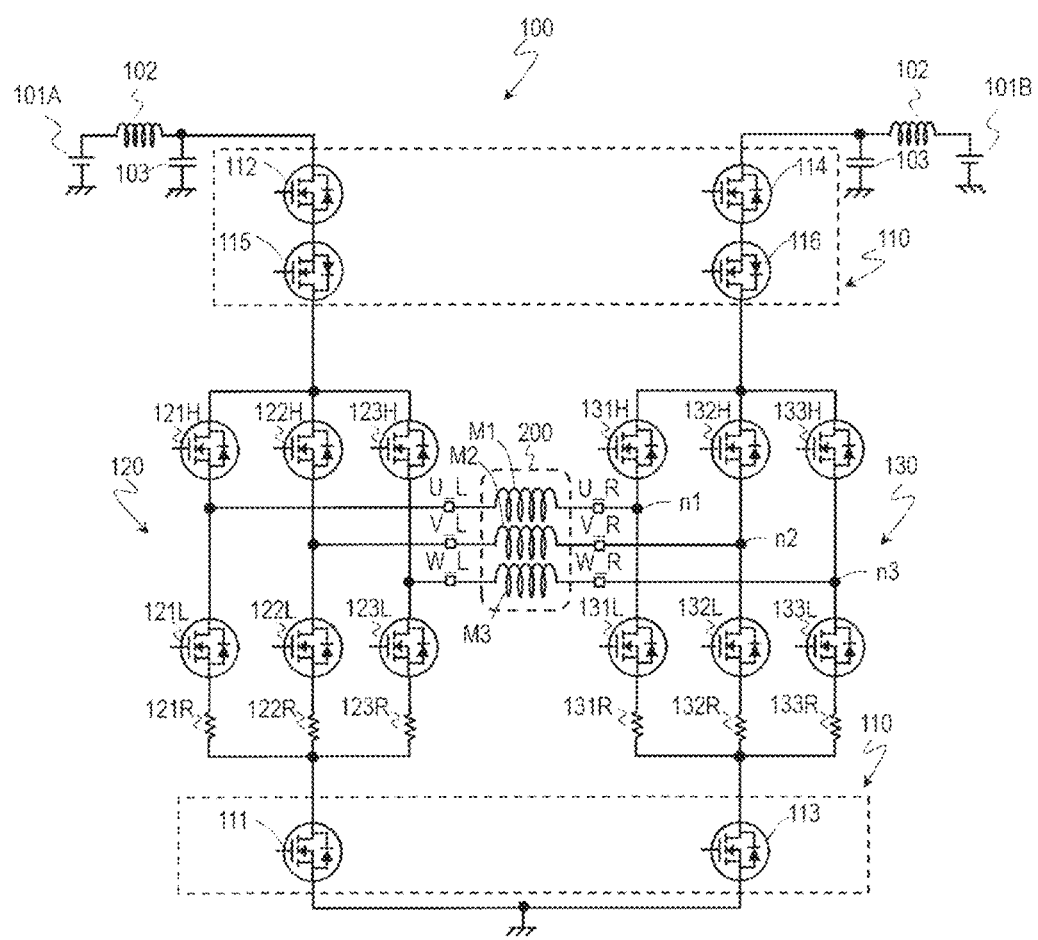
FIG. 1 is a circuit diagram illustrating a circuit configuration of an inverter unit 100 according to a first example embodiment of the present disclosure.

FIG. 1 schematically illustrates a circuit configuration of an inverter unit 100 according to the present example embodiment.

The inverter unit 100 includes a power cutoff circuit 110, a first inverter 120, and a second inverter 130. The inverter unit 100 can convert power from power supplies 101A and 101B into power to be supplied to the motor 200. For example, the first and second inverters 120 and 130 can convert DC power into three-phase AC power that is a pseudo sine wave of a U phase, a V phase, and a W phase.

The motor 200 is, for example, a three-phase AC motor. The motor 200 includes a U-phase winding M1, a V-phase winding M2, and a W-phase winding M3, and is connected to the first inverter 120 and the second inverter 130. Specifically, the first inverter 120 is connected to one end of the winding of each phase of the motor 200, and the second inverter 130 is connected to the other end of the winding of each phase. In the present specification, "connection" between parts (components) mainly means electrical connection.

The first inverter 120 has terminals U_L, V_L, and W_L corresponding to the respective phases. The second inverter 130 has terminals U_R, V_R and W_R corresponding to the respective phases. The terminal U_L of the first inverter 120 is connected to one end of the U-phase winding M1, the terminal V_L is connected to one end of the V-phase winding M2, and the terminal W_L is connected to one end of the W-phase winding M3. Similarly to the first inverter 120, the terminal U_R of the second inverter 130 is connected to the other end of the U-phase winding M1, the terminal V_R is connected to the other end of the V-phase winding M2, and the terminal W_R is connected to the other end of W-phase winding M3. Such motor connection is different from so-called star connection and delta connection.

The power cutoff circuit 110 includes first to fourth switching elements 111, 112, 113, and 114. In the inverter unit 100, the first inverter 120 can be electrically connected to the power supply 101A and GND by the power cutoff circuit 110. The second inverter 130 can be electrically connected to the power supply 101B and the GND by the power cutoff circuit 110. Specifically, the first switching element 111 switches connection/disconnection between the first inverter 120 and the GND. The second switching element 112 switches connection/disconnection between the power supply 101 and the first inverter 120. The third switching element 113 switches connection/disconnection between the second inverter 130 and the GND. The fourth switching element 114 switches connection/disconnection between the power supply 101 and the second inverter 130.

On/off of the first to fourth switching elements 111, 112, 113, and 114 can be controlled by, for example, a microcontroller or a dedicated driver. The first to fourth switching elements 111, 112, 113, and 114 can cut off a bidirectional current. As the first to fourth switching elements 111, 112, 113 and 114, for example, a semiconductor switch such as a thyristor, an analog switch IC, and a field-effect transistor (typically, a MOSFET) having a parasitic diode formed therein, a mechanical relay, and the like can be used. A combination of a diode and an insulated gate bipolar transistor (IGBT) may be used. The drawings in the present specification illustrate an example in which the MOSFET is used as the first to fourth switching elements 111, 112, 113, and 114. Hereinafter, the first to fourth switching elements 111, 112, 113, and 114 are referred to as SW 111, 112, 113, and 114, respectively, in some cases.

The SW 111 is arranged such that a forward current flows in an internal parasitic diode toward the first inverter 120. The SW 112 is arranged such that a forward current flows in a parasitic diode toward the power supply 101A. The SW 113 is arranged such that a forward current flows in a parasitic diode toward the second inverter 130. The SW 114 is arranged such that a forward current flows in a parasitic diode toward the power supply 101B.

As illustrated in the drawing, it is preferable that the power cutoff circuit 110 further include fifth and sixth switching elements 115 and 116 for reverse connection protection. The fifth and sixth switching elements 115 and 116 are typically MOSFET semiconductor switches having parasitic diodes. The fifth switching element 115 is connected in series to the SW 112, and is arranged such that a forward current flows in the parasitic diode toward the first inverter 120. The sixth switching element 116 is connected in series to the SW 114, and is arranged such that a forward current flows in the parasitic diode toward the second inverter 130. Even when the power supplies 101A and 101B are connected reversely, a reverse current can be cut off by the two switching elements for reverse connection protection.

The number of switching elements to be used is not limited to the illustrated example, and is appropriately determined in consideration of design specifications and the like. Particularly in the in-vehicle field, high quality assurance is required from the viewpoint of safety, and thus, it is preferable to provide a plurality of switching elements for each inverter.

The power supply can include the power supply 101A for the first inverter 120 and the power supply 101B for the second inverter 130. The power supplies 101A and 101B generate a predetermined power supply voltage (for example, 12 V). As the power supply, for example, a DC power supply is used. However, the power supply may be an AC-DC converter and a DC-DC converter or may be a battery (storage battery). In addition, the power supply 101 may be a single power supply common to the first and second inverters 120 and 130.

A coil 102 is provided between the power supplies 101A and 101B and the power cutoff circuit 110. The coil 102 functions as a noise filter, and smoothes high frequency noise included in a voltage waveform supplied to each inverter or high frequency noise generated by each inverter so as not to flow out to the power supply side.

A capacitor 103 is connected to a power supply terminal of each inverter. The capacitor 103 is a so-called bypass capacitor and suppresses a voltage ripple. The capacitor 103 is, for example, an electrolytic capacitor, and the capacitance and the number to be used are appropriately determined according to design specifications and the like.

The first inverter 120 includes a bridge circuit having three legs. Each leg has a low-side switching element and a high-side switching element. A U-phase leg has a low-side switching element 121L and a high-side switching element 121H. A V-phase leg has a low-side switching element 122L and a high-side switching element 122H. A W-phase leg includes a low-side switching element 123L and a high-side switching element 123H. As the switching element, for example, a FET or an IGBT can be used. Hereinafter, an example in which a MOSFET is used as a switching element will be described, and the switching element is referred to as SW in some cases. For example, the switching elements 121L, 122L, and 123L are referred to as SW 121L, 122L, and 123L, respectively.

The first inverter 120 includes three shunt resistors 121R, 122R and 123R as a current sensor 150 (see FIG. 3) configured to detect a current flowing in each phase winding of the U phase, the V phase, and the W phase. The current sensor 150 includes a current detection circuit (not illustrated) that detects a current flowing in each shunt resistor. For example, each of the shunt resistors 121R, 122R, and 123R are connected between each of the three low-side switching elements included in the three legs of the first inverter 120 and the GND. Specifically, the shunt resistor 121R is electrically connected between the SW 121L and the SW 111, and the shunt resistor 122R is electrically connected between the SW 122L and the SW 111, and the shunt resistor 123R is electrically connected between the SW 123L and the SW 111. A resistance value of the shunt resistor is, for example, about 0.5 mΩ to 1.0 mΩ.

The second inverter 130 includes a bridge circuit having three legs, which is similar to the first inverter 120. A U-phase leg has a low-side switching element 131L and a high-side switching element 131H. A V-phase leg has a low-side switching element 132L and a high-side switching element 132H. A W-phase leg includes a low-side switching element 133L and a high-side switching element 133H. In addition, the second inverter 130 includes three shunt resistors 131R, 132R, and 133R. Each of these shunt resistors is connected between each of the three low-side switching elements included in the three legs and the GND.

The number of shunt resistors is not limited to three for each inverter. For example, it is possible to use two shunt resistors for the U phase and the V phase, two shunt resistors for the V phase and the W phase, and two shunt resistors for the U phase and the W phase. The number of shunt resistors to be used and the arrangement of the shunt resistors are appropriately determined in consideration of product cost and design specifications.

As described above, the second inverter 130 has substantially the same structure as the structure of the first inverter 120. In FIG. 1, the left inverter on the paper surface is referred to as the first inverter 120, and the right inverter is referred to as the second inverter 130 for convenience of the description. However, such notation should not be construed with the intention of limiting the present disclosure. The first and second inverters 120 and 130 can be used without distinction as components of the inverter unit 100.

Figure 2:
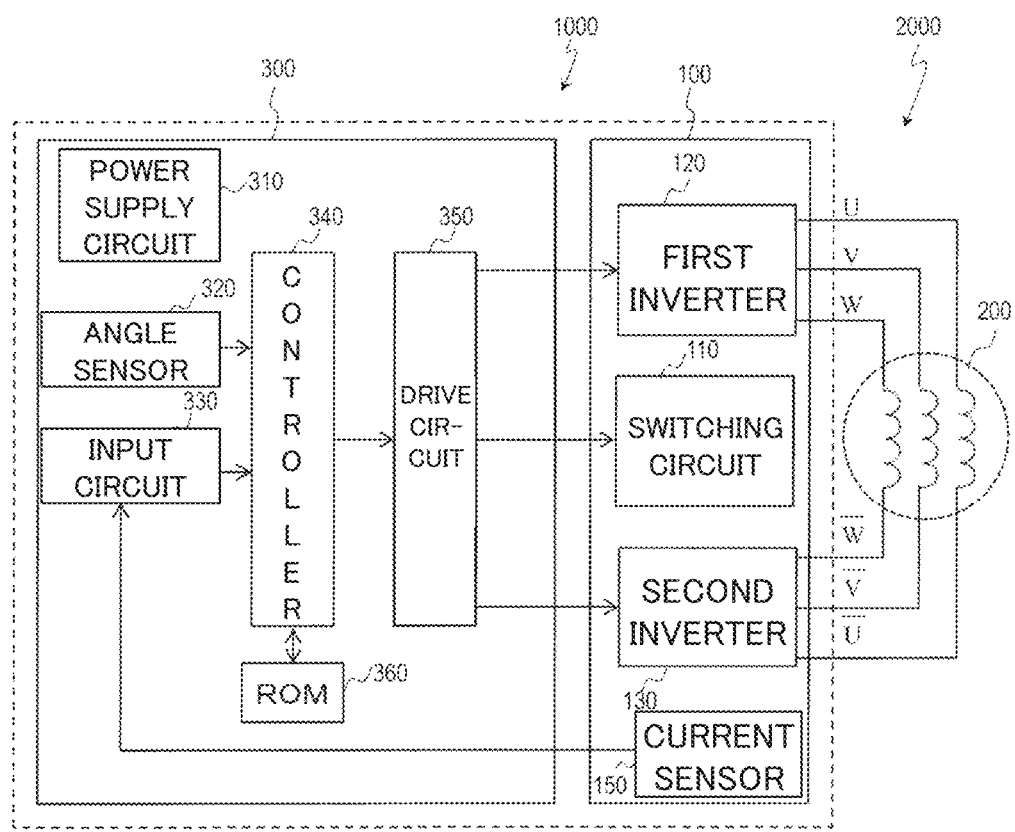
FIG. 2 is a block configuration diagram illustrating a block configuration of a motor module 2000 according to the first example embodiment of the present disclosure, which mainly illustrates a block configuration of a power conversion device 1000.

FIG. 2 schematically illustrates a block configuration of a motor module 2000 according to the present example embodiment, which schematically illustrates a block configuration of a power conversion device 1000 mainly.

The motor module 2000 includes the power conversion device 1000 having the inverter unit 100 and a control circuit 300, and the motor 200.

The motor module 2000 is modularized and can be manufactured and sold as, for example, an electromechanically integrated motor having a motor, a sensor, a driver, and a controller. In addition, the power conversion device 1000 other than the motor 200 can be modularized and manufactured and sold.

The control circuit 300 includes, for example, a power supply circuit 310, an angle sensor 320, an input circuit 330, a controller 340, a drive circuit 350, and a ROM 360. The control circuit 300 is connected to the inverter unit 100 and drives the motor 200 by controlling the inverter unit 100.

Specifically, the control circuit 300 can realize closed loop control by controlling a position, a rotational speed, a current, and the like of a rotor of the target motor 200. Note that the control circuit 300 may include a torque sensor instead of the angle sensor 320. In this case, the control circuit 300 can control a target motor torque.

The power supply circuit 310 generates a DC voltage (for example, 3 V or 5 V) necessary for each block in the circuit. The angle sensor 320 is, for example, a resolver or a Hall IC. Alternatively, the angle sensor 320 is also realized by a combination of an MR sensor having a magnetoresistive (MR) element and a sensor magnet. The angle sensor 320 detects a rotation angle of the rotor (hereinafter referred to as "rotation signal") and outputs the rotation signal to the controller 340.

The input circuit 330 receives a motor current value detected by the current sensor 150 (hereinafter, referred to as "actual current value"), converts a level of the actual current value into an input level of the controller 340 as necessary, and outputs the actual current value to the controller 340. The input circuit 330 is, for example, an analog/digital conversion circuit.

The controller 340 is an integrated circuit that controls the entire power conversion device 1000, and is, for example, a microcontroller or a field programmable gate array (FPGA). The controller 340 controls a switching operation (turning-on or turning-off) of each SW in the first and second inverters 120 and 130 of the inverter unit 100. The controller 340 sets a target current value according to the actual current value and the rotation signal of the rotor, generates a PWM signal, and outputs the PWM signal to the drive circuit 350.

In addition, the controller 340 can control on/off of each SW in the power cutoff circuit 110 of the inverter unit 100.

The drive circuit 350 is typically a gate driver (or pre-driver). The drive circuit 350 generates a control signal (gate control signal) to control the switching operation of the MOSFET of each SW in the first and second inverters 120 and 130 according to the PWM signal, and gives the control signal to a gate of each SW. In addition, the drive circuit 350 can generate a control signal to control on/off of each SW in the power cutoff circuit 110 according to an instruction from the controller 340. There is a case where a gate driver is not necessarily required when a driving target is a motor that can be driven at a low voltage. In such a case, a function of the gate driver may be implemented in the controller 340.

The ROM 360 is, for example, a writable memory (for example, a PROM), a rewritable memory (for example, a flash memory), or a read-only memory. The ROM 360 stores a control program including a command group configured to cause the controller 340 to control the power conversion device 1000 and a command group configured for execution of various failure diagnoses to be described later. For example, the control program is temporarily expanded in a RAM (not illustrated) at the time of booting.

First, a specific example of a control method when the power conversion device 1000 is normal will be described. Normality means a state where each SW of the first inverter 120, the second inverter 130, and the power cutoff circuit 110 has not failed and none of the three-phase windings M1, M2, and M3 of the motor 200 has failed. In the present specification, it is assumed that the SWs 115 and 116 for reverse connection protection of the power cutoff circuit 110 are always turned on.

At normal time, the control circuit 300 turns on all the SWs 111, 112, 113, and 114 of the power cutoff circuit 110. As a result, the power supply 101A and the first inverter 120 are electrically connected, and the power supply 101B and the second inverter 130 are electrically connected. In addition, the first inverter 120 and the GND are electrically connected, and the second inverter 130 and the GND are electrically connected. In such a connection state, the control circuit 300 drives the motor 200 by energizing the windings M1, M2, and M3 using both the first and second inverters 120 and 130. In the present specification, the energization of the three-phase winding is referred to as "three-phase energization control", and the energization of the two-phase winding is referred to as "two-phase energization control".

Figure 3:
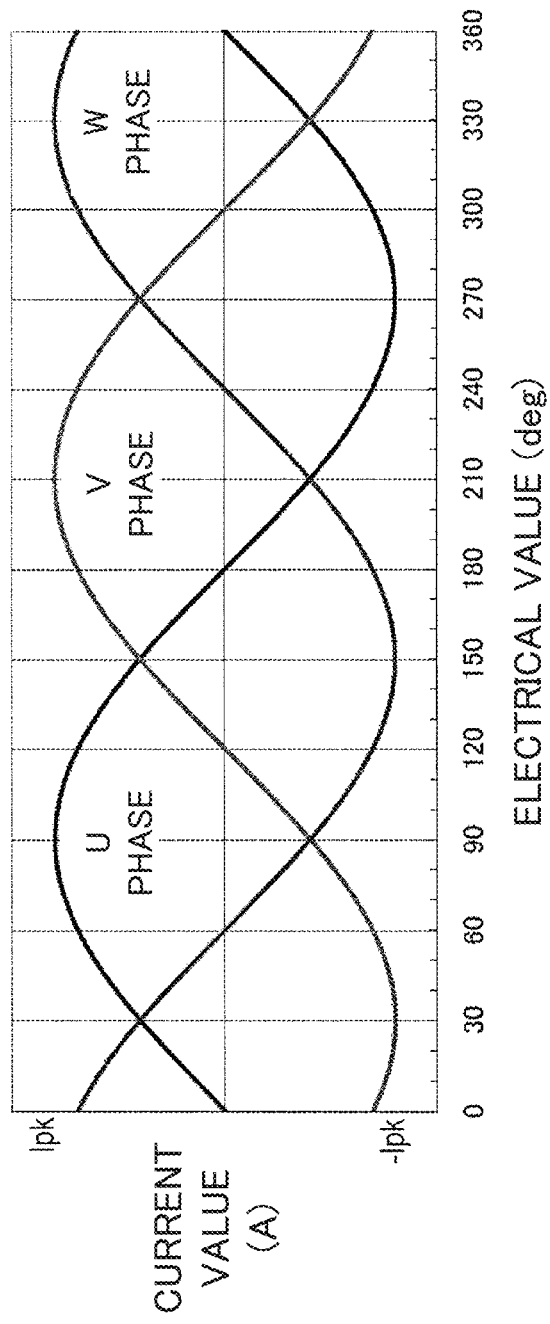
FIG. 3 is a graph illustrating a current waveform (sine wave) obtained by plotting current values flowing through U-phase, V-phase, and W-phase windings of a motor 200 when the power conversion device 1000 is controlled according to three-phase energization control.

FIG. 3 illustrates a current waveform (sine wave) obtained by plotting current values flowing through the U-phase, V-phase, and W-phase windings of the motor 200 when the power conversion device 1000 is controlled according to the three-phase energization control. The horizontal axis indicates a motor electrical angle (deg), and the vertical axis indicates a current value (A). In the current waveform of FIG. 3, the current value is plotted every electrical angle of 30°. $I_{pk}$ represents the maximum current value (peak current value) of each phase.

In the current waveform illustrated in FIG. 3, the sum of currents flowing through the three-phase windings considering the direction of the current is "0" for each electrical angle. However, the currents flowing through the three-phase winding can be controlled independently according to a circuit configuration of the power conversion device 1000, and thus, it is also possible to perform control in which the total sum of currents does not become "0". For example, the control circuit 300 controls the switching operation of each switching element of the first and second inverters 120 and 130 by PWM control with which the current waveform illustrated in FIG. 3 can be obtained.

Abnormality mainly means (1) a failure of the switching element of each inverter and (2) a failure of the winding of the motor 200. (1) The failure of the switching element of each inverter can be broadly divided into "off failure (open failure)" and "on failure (short failure)". "Off failure" indicates a failure in which a portion between a source and a drain of a FET is open (in other words, a resistance rds between the source and the drain becomes high impedance), and "on failure" refers to a failure in which the source and the drain of the FET are short-circuited. (2) The failure of the winding of the motor 200 mainly indicates the disconnection of the winding.

When the power conversion device 1000 is used for a long period of time, at least one of the plurality of SWs and the three-phase windings of the two inverters is likely to fail. Such failures are different from a manufacturing failure that may occur during manufacturing. If one of the switching elements fails, the three-phase energization control in the normal state becomes impossible. In addition, if one of the windings M1, M2, and M3 is disconnected, the three-phase energization control in the normal state becomes impossible.

The control circuit 300 (mainly the controller 340) can diagnose a winding disconnection failure and the on or off failure of the SW in the inverter on the assumption that the drive circuit (gate driver) 350 has not failed. Typically, the controller 340 preferably performs an initial diagnosis on the SW failure and the winding failure when the power conversion device 1000 is powered on and the control circuit 300 is activated. However, the controller 340 may periodically diagnose the SW failure and the winding failure in the control in the normal state. In such a case, it is desirable to make a diagnosis time as short as possible so as not to affect the motor control. For example, the diagnosis time is preferably suppressed to 30 ms or less.

The controller 340 diagnoses the SW failure of the inverter. Specifically, the controller 340 can identify the SW with the on or off failure from among the twelve SWs of the first and second inverters 120 and 130. The SW failure diagnosis has a first failure diagnosis to diagnose the on failure of the SW and a second failure diagnosis to diagnose the off failure of the SW.

For example, the controller 340 performs the first failure diagnosis on the first inverter 120 and then executes the first failure diagnosis on the second inverter 130. When the first failure diagnosis is completed, the controller 340 executes the second failure diagnosis on the first inverter 120, and then executes the second failure diagnosis on the second inverter 130.

The first failure diagnosis includes the following steps.

(1) The controller 340 generates a control signal to turn off all three low-side switching elements and three high-side switching elements in one (the inverter to be diagnosed) of the first and second inverters 120 and 130 and three low-side switching elements and three high-side switching elements in the other (the inverter not to be diagnosed).

(2) The drive circuit 350 gives the control signal to all the SWs of the first and second inverters 120 and 130 under the control of the controller 340. The controller 340 measures three-phase voltages Vu, Vv, and Vw appearing at one end of each of the windings M1, M2, and M3. For example, the controller 340 can acquire the three-phase voltages Vu, Vv, and Vw by measuring terminal voltages of terminals (for example, the terminals U_L, V_L, and W_L) of the inverter to be diagnosed. In the first failure diagnosis, the three-phase voltages Vu, Vv, and Vw change depending on the patterns of on failures of the SWs.

(3) The controller 340 refers to a look-up table (hereinafter, referred to as "LUT") associating the patterns of on failures of the SWs with the three-phase voltage levels, and diagnoses on failures of the three low-side switching elements and three high-side switching elements in the inverter to be diagnosed based on the measured three-phase voltages Vu, Vv, and Vw.

Hereinafter, the first failure diagnosis will be described in detail by taking the case where the first inverter 120 is to be diagnosed as an example.

FIG. 4 illustrates a specific example of an LUT that associates various failure patterns with three-phase voltage levels.

The LUT has failure diagnosis information illustrated in FIG. 4, for example, which associates the patterns of on failures of the SWs with the three-phase voltage levels Vu, Vv and Vw. There are mainly three patterns of on failures of the SWs: the on failure of the high-side switching element or the low-side switching element of the U-phase leg of the inverter, the on failure of the high-side switching element or the low-side switching element of the V-phase leg, and the on failure of the high-side switching element or the low-side switching element of the W-phase leg.

Each level of the three-phase voltages Vu, Vv, and Vw may be any level among a first level (low level: L level), a second level (intermediate level: M level), and a third level (high level: H level). When the power supply voltage is 12.0 V, the first level is higher than a GND level, for example, about 1.0 V. The second level is higher than the first level, for example, about 9.0 V. The third level is higher than the second level and lower than a voltage level of the power supply. The third level is, for example, about 12.0 V.

The controller 340 generates a control signal to turn on the SWs 111 and 112 of the power cutoff circuit 110 in the first failure diagnosis. The control signal is given from the drive circuit 350 to the SWs 111 and 112, and the SWs 111 and 112 are turned on. Here, turning on the SWs 111 and 112 in the first failure diagnosis is referred to as "turning on the power cutoff circuit 110" in some cases. On the other hand, the controller 340 generates a control signal to turn off the SWs 113 and 114 of the power cutoff circuit 110. The control signal is given from the drive circuit 350 to the SWs 113 and 114, and the SWs 113 and 114 are turned off. As a result, the first inverter 120 is connected to the power supply 101A and the GND, and the second inverter 130 is disconnected from the power supply 101B and the GND. Incidentally, the first failure diagnosis has a precondition that the SWs 111, 112, 113, and 114 have not failed.

The controller 340 generates a control signal to turn off all the SWs of the first and second inverters 120 and 130. A gate control signal is given from the drive circuit 350 to the SWs 121L, 122L, 123L, 121H, 122H, 123H, 131L, 132L, 133L, 131H, 132H, and 133H to turn off them.

When each of the measured three-phase voltages Vu, Vv and Vw indicates the intermediate level, the controller 340 can determine that all of the SWs 121L, 122L, 123L, 121H, 122H, and 123H of the first inverter 120 have no on failure.

Although not illustrated, voltage-dividing resistors are provided in the terminals U_L, V_L, and W_L of the first inverter 120 and the terminals U_R, V_R, and W_R of the second inverter 130, respectively. The voltage-dividing resistor has a resistance value at which a terminal voltage is in the vicinity of an intermediate voltage (for example, 6 V) of the power supply voltage when all the high-side switching elements and the low-side switching elements of the legs of the respective phases are in the off state. Therefore, when all the SWs of the first and second inverters 120 and 130 are in the off state, that is, when have no on failure, terminal voltages of the terminals U_L, V_L, and W_L of the first inverter 120 indicate the intermediate level.

When a phase voltage of one phase among the three phases indicates the low level and phase voltages of the remaining two phases indicate the intermediate level, the controller 340 can detect the on failure of the low-side switching element of the phase whose phase voltage indicates the low level. This is because the low-level voltage appears at the terminal of the inverter in the phase with the on failure via the SW when the low-side switching element has the on failure.

When a phase voltage of the U phase indicates the low level and phase voltages of the V and W phases indicate the intermediate level, the controller 340 detects an on failure of the SW 121L of the U-phase leg of the first inverter. Similarly to the U phase, when a phase voltage of the V phase indicates the low level and phase voltages of the U and W phases indicate the intermediate level, the controller 340 detects an on failure of the SW 122L of the V-phase leg of the first inverter. When a phase voltage of the W phase indicates the low level and phase voltages of the U and V phases indicate the intermediate level, the controller 340 detects an on failure of the SW 123L of the W-phase leg of the first inverter.

When a phase voltage of one phase among the three phases indicates the high level and phase voltages of the remaining two phases indicate the intermediate level, the controller 340 can detect the on failure of the high-side switching element of the phase whose phase voltage indicates the high level. This is because the high-level voltage appears at the terminal of the inverter in the phase with the on failure via the SW when the high-side switching element has the on failure.

When a phase voltage of the U phase indicates the high level and phase voltages of the V and W phases indicate the intermediate level, the controller 340 detects an on failure of the SW 121H of the U-phase leg of the first inverter. Similarly to the U phase, when a phase voltage of the V phase indicates the high level and phase voltages of the U and W phases indicate the intermediate level, the controller 340 detects an on failure of the SW 122H of the V-phase leg of the first inverter. When a phase voltage of the W phase indicates the high level and phase voltages of the U and V phases indicate the intermediate level, the controller 340 detects an on failure of the SW 123H of the W-phase leg of the first inverter.

The second failure diagnosis includes the following steps configured to diagnose an off failure of a low-side switching element.

(1) The controller 340 generates a control signal to turn on three low-side switching elements and turn off three high-side switching elements in one (the inverter to be diagnosed) of the first and second inverters 120 and 130, and generates a control signal to turn off all of three low-side switching elements and three high-side switching elements in the other (the inverter not to be diagnosed).

(2) The drive circuit 350 gives the control signal to all the SWs of the first and second inverters 120 and 130 under the control of the controller 340. The controller 340 measures three-phase voltages Vu, Vv, and Vw appearing at one end of each of the windings M1, M2, and M3. For example, the controller 340 can acquire the three-phase voltages Vu, Vv, and Vw by measuring terminal voltages of terminals (for example, the terminals U_L, V_L, and W_L) of the inverter to be diagnosed.

(3) The controller 340 refers to the LUT associating patterns of off failures of the low-side SWs with the three-phase voltage levels, and diagnoses off failures of the three low-side switching elements in the inverter to be diagnosed based on the measured three-phase voltages Vu, Vv, and Vw.

The second failure diagnosis further includes the following steps configured to diagnose an off failure of a high-side switching element.

(4) The controller 340 generates a control signal to turn on three high-side switching elements and turn off three low-side switching elements in one (the inverter to be diagnosed) of the first and second inverters 120 and 130, and generates a control signal to turn off all of three low-side switching elements and three high-side switching elements in the other (the inverter not to be diagnosed).

(5) The drive circuit 350 gives the control signal to all the SWs of the first and second inverters 120 and 130 under the control of the controller 340. The controller 340 measures three-phase voltages Vu, Vv, and Vw appearing at one end of each of the windings M1, M2, and M3.

(6) The controller 340 refers to the LUT further associating patterns of off failures of the high-side SWs with the three-phase voltage levels, and diagnoses off failures of the three high-side switching elements in the inverter to be diagnosed based on the measured three-phase voltages Vu, Vv, and Vw. In the second failure diagnosis, the three-phase voltages Vu, Vv, and Vw change depending on the patterns of off failures of the SWs.

Hereinafter, the second failure diagnosis will be described in detail by taking the case where the first inverter 120 is to be diagnosed as an example.

The LUT has failure diagnosis information illustrated in FIG. 4, for example, which further associates the patterns of off failures of the SWs with the three-phase voltage levels Vu, Vv and Vw. There are mainly three patterns of off failures of the SWs: the off failure of the high-side switching element or the low-side switching element of the U-phase leg of the inverter, the off failure of the high-side switching element or the low-side switching element of the V-phase leg, and the off failure of the high-side switching element or the low-side switching element of the W-phase leg.

The controller 340 generates a control signal to turn on the SWs 111 and 112 of the power cutoff circuit 110 in the second failure diagnosis. The control signal is given from the drive circuit 350 to the SWs 111 and 112, and the SWs 111 and 112 are turned on. On the other hand, the controller 340 generates a control signal to turn off the SWs 113 and 114 of the power cutoff circuit 110. The control signal is given from the drive circuit 350 to the SWs 113 and 114, and the SWs 113 and 114 are turned off. Incidentally, the second failure diagnosis also has a precondition that the SWs 111, 112, 113, and 114 have not failed.

First, the controller 340 generates a control signal to turn on only the SWs 121L, 122L, and 123L of the first inverter 120 among the SWs of the first and second inverters 120 and 130 and turn off the remaining SWs. A gate control signal is given from the drive circuit 350 to the SWs 121L, 122L, and 123L to turn on them. A gate control signal is supplied given the drive circuit 350 to the SWs 121H, 122H, 123H, 131L, 132L, 133L, 131H, 132H, and 133H to turn off them.

When each of the measured three-phase voltages Vu, Vv, and Vw indicates the low level, the controller 340 can determine that the SWs 121L, 122L, and 123L of the first inverter 120 have no off failure. This is because the low-level voltage appears at the three-phase terminals U_L, V_L, and W_L of the first inverter 120 via these SWs when all the low-side switching elements are turned on.

When a phase voltage of one phase among the three phases indicates the intermediate level and phase voltages of the remaining two phases indicate the low level, the controller 340 can detect the off failure of the low-side switching element of the phase whose phase voltage indicates the intermediate level. This is because not the low-level voltage but the voltage of the voltage-dividing resistor described above appears at the terminal of the phase with the off failure of the first inverter 120 when the low-side switching element has the off failure.

When a phase voltage of the U phase indicates the intermediate level and phase voltages of the V and W phases indicate the low level, the controller 340 detects an off failure of the SW 121L of the U-phase leg of the first inverter. Similarly to the U phase, when a phase voltage of the V phase indicates the intermediate level and phase voltages of the U and W phases indicate the low level, the controller 340 detects an off failure of the SW 122L of the V-phase leg of the first inverter. When a phase voltage of the W phase indicates the intermediate level and phase voltages of the U and V phases indicate the low level, the controller 340 detects an off failure of the SW 123L of the W-phase leg of the first inverter.

Next, the controller 340 generates a control signal to turn on only the SWs 121H, 122H, and 123H of the first inverter 120 among the SWs of the first and second inverters 120 and 130 and turn off the remaining SWs. A gate control signal is given from the drive circuit 350 to the SWs 121H, 122H, and 123H to turn on them. A gate control signal is given from the drive circuit 350 to the SWs 121L, 122L, 123L, 131L, 132L, 133L, 131H, 132H, and 133H to turn off them.

When each of the measured three-phase voltages Vu, Vv, and Vw indicates the high level, the controller 340 can determine that the SWs 121H, 122H, and 123H of the first inverter 120 have no off failure. This is because the high-level voltage appears at the three-phase terminals U_L, V_L, and W_L of the first inverter 120 via these SWs when all the high-side switching elements are turned on.

When a phase voltage of one phase among the three phases indicates the intermediate level and phase voltages of the remaining two phases indicate the high level, the controller 340 can detect the off failure of the high-side switching element of the phase whose phase voltage indicates the intermediate level. This is because not the high-level voltage but the voltage of the voltage-dividing resistor described above appears at the terminal of the phase with the off failure of the first inverter 120 when the high-side switching element has the off failure.

When a phase voltage of the U phase indicates the intermediate level and phase voltages of the V and W phases indicate the high level, the controller 340 detects an off failure of the SW 121H of the U-phase leg of the first inverter. Similarly to the U phase, when a phase voltage of the V phase indicates the intermediate level and phase voltages of the U and W phases indicate the high level, the controller 340 detects an off failure of the SW 122H of the V-phase leg of the first inverter. When a phase voltage of the W phase indicates the intermediate level and phase voltages of the U and V phases indicate the high level, the controller 340 detects an off failure of the SW 123H of the W-phase leg of the first inverter.

It is preferable to diagnose the off failure after diagnosing the on failure first. For example, it is assumed that the SW 121H of the U-phase leg of the first inverter 120 has the on failure. In such a case, when the SW 121L is turned on in the off failure diagnosis, both the high-side switching element and the low-side switching element of the U-phase leg are turned on, and an energization path is likely to be short-circuited. This can be avoided by the above-described diagnosis order.

The off failure diagnosis is performed with a premise that there are no more than two on failures of SWs in the on failure diagnosis. However, even if a cutoff switching element in an inverter not to be diagnosed has an on failure, the on failure diagnosis can be performed if all of the high-side switching elements and the low-side switching elements can be turned off.

When the controller 340 completes the diagnosis of the on or off failures of the SWs, the controller 340 uses a neutral point of the motor 200 to diagnose the winding disconnection failure. Specifically, the controller 340 can identify a disconnected winding from among the windings M1, M2, and M3. The completion of the diagnosis of the on/off failure of the SW is a precondition for the diagnosis of the winding disconnection failure.

The diagnosis of the winding disconnection failure has a third failure diagnosis. The controller 340 executes the third failure diagnosis by causing nodes in one of the first and second inverters 120 and 130 (for example, the second inverter 130) to function as the neutral points of the motor 200 and turning on or off the switching elements of the other (for example, the first inverter 120) in a predetermined pattern.

The third failure diagnosis includes the following steps.

(1) The controller 340 generates a control signal to turn on one low-side switching element of a first specific phase among the three low-side switching elements in the other inverter and turn off the remaining two low-side switching elements, and turn off all the three high-side switching elements. The first specific phase may be any one phase among the U, V, and W phases.

(2) Under the control of the controller 340, the drive circuit 350 gives the control signal to the three low-side switching elements and the three high-side switching elements of the other inverter in a state where the neutral points of the motor 200 are configured in the one inverter. The controller 340 measures three-phase voltages Vu, Vv, Vw appearing at one end of each of the windings M1, M2, and M3. In the third failure diagnosis, the three-phase voltages Vu, Vv, and Vw change depending on the winding disconnection failure pattern.

The controller 340 turns on or off the switching elements of the one inverter in a predetermined pattern to cause the nodes in the inverter to function as the neutral points of the motor 200. According to the predetermined pattern, potentials of three nodes (for example, nodes n1, n2, and n3 in the second inverter 130 in FIG. 1) between the high-side switching elements and the low-side switching elements in the three legs of the one inverter become equal.

(3) The controller 340 refers to the LUT associating the winding disconnection failure pattern with levels of the three-phase voltages Vu, Vv, and Vw and diagnose the disconnection failure based on the measured three-phase voltages Vu, Vv, and Vw.

FIG. 4 will be referred to again.

The LUT further includes failure diagnosis information which associates the patterns of disconnection failures of the windings with the levels of the three-phase voltages Vu, Vv, and Vw. There are mainly three patterns of disconnection failures of the windings: disconnection of the U-phase winding M1, disconnection of the V-phase winding M2, and disconnection of the W-phase winding M3.

Hereinafter, specific diagnosis steps for executing the third failure diagnosis by causing the nodes in the second inverter 130 to function as the neutral points of the motor 200 will be described. It is also possible to execute the third failure diagnosis by causing the nodes in the first inverter 120 to function as the neutral points of the motor 200.

The controller 340 generates a control signal to turn on the SWs 111 and 112 of the power cutoff circuit 110 and turn off the SWs 113 and 114. Here, turning on the SWs 111 and 112 when executing the third failure diagnosis is referred to as "turning on the power cutoff circuit 110" in some cases. The control signal is given from the drive circuit 350 to the SWs 111, 112, 113, and 114, the SWs 111 and 112 are turned on, and the SWs 113 and 114 are turned off. As a result, the first inverter 120 is connected to the power supply 101A and the GND, and the second inverter 130 is disconnected from the power supply 101B and the GND. Incidentally, the third failure diagnosis also has a precondition that the SWs 111, 112, 113, and 114 have not failed.

The controller 340 causes the nodes of the inverter to function as the neutral points of the motor 200 by turning on or off the switching elements of the second inverter 130 in a predetermined pattern. Examples of the predetermined pattern may include a pattern A for turning on the high-side SWs 131H, 132H, and 133H and turning off the low-side SWs 131L, 132L, and 133L of the second inverter 130, a pattern B for turning off the high-side SWs 131H, 132H, and 133H and turning on the low-side SWs 131L, 132L, and 133L, and a pattern C for turning on all the SWs of the second inverter 130.

In the present example embodiment, the controller 340 causes the nodes in the second inverter 130 to function as the neutral points using the pattern A. In other words, the controller 340 makes the potentials of the nodes n1, n2, and n3 of the second inverter 130 equal using the pattern A. A gate control signal is given from the drive circuit 350 to the SWs of the second inverter.

The controller 340 generates a control signal to turn off the high-side SWs 121H, 122H, and 123H of the first inverter 120. In the present example embodiment, the first specific phase is the U phase. As described above, the first characteristic phase may be the V or W phase. The controller 340 further turns on the low-side SW 121L of the U phase of the first inverter 120, and turns off the SWs 122L and 123L of the remaining two phases. A gate control signal is given from the drive circuit 350 to the SW 121L to turn on the SW 121L, and a gate control signal is given to the SWs 122L, 123L, 121H, 122H, and 123H to turn off them.

When each of the measured three-phase voltages Vu, Vv, and Vw indicates the low level, the controller 340 determines that the windings M1, M2, and M3 are not disconnected. In other words, it is possible to determine that three-phase energization paths are normal. When the SW 121L of the U-phase that is the first specific phase is turned on in the state where the nodes in the second inverter 130 function as the neutral points, the low-level voltage appears at the terminals L_V and L_W of the first inverter 120 via the windings M2, and M3.

When a phase voltage of one phase among the three phases indicates the low level and phase voltages of the remaining two phases indicate the intermediate level, the controller 340 detects a disconnection failure of a winding of the first specific phase. Specifically, when a phase voltage of the U phase that is the first specific phase indicates the low level and phase voltages of the V and W phases indicate the intermediate level, the controller 340 can detect a disconnection failure of the winding M1 of the U phase. This is because, when the U-phase winding M1 is disconnected, the low-level voltage does not appear at the terminals L_V and L_W of the first inverter 120 via the windings M1, M2, and M3 even if the U-phase SW 121L is turned on. Instead, the voltage of the voltage-dividing resistor described above appears at the terminals L_V and L_W.

When a phase voltage of one phase among phases other than the first specific phase indicates the intermediate level and phase voltages of the remaining two phases indicate the low level, the controller 340 detects disconnection of a winding of the phase indicating the intermediate level. Specifically, when a phase voltage of the V phase indicates the intermediate level and phase voltages of the U and W phases indicate the low level, the controller 340 can detect a failure of the V-phase winding M2. When a phase voltage of the W phase indicates the intermediate level and phase voltages of the U and V phases indicate the low level, the controller 340 can detect a failure of the W-phase winding M3. This is because the low-level voltage appears at the terminal L_W of the first inverter 120 via the windings M1 and M3 but does not appear at the terminal L_V via the windings M1 and M2, for example, when the V-phase winding M2 is disconnected and the U-phase the SW 121L is turned on.

For example, when determining that the high-side SW 131H of the second inverter has the off failure or that the low-side SW 131L has the on failure in the diagnosis of the on or off failures of the SWs, the controller 340 can cause the nodes in the second inverter to function as the neutral points by turning on the low-side SWs 131L, 132L, and 133L. In this manner, the controller 340 can select which of the three patterns described above is to be used based on the patterns of the on or off failures of the SWs.

For example, it is assumed that one of the SWs 121L, 122L, 123L, 121L, 122L, and 123L has the on failure or the off failure, or at least one of the third and fourth switching elements 113 and 114 has the on failure in the first inverter 120. In such a case, the controller 340 can measure the three-phase voltages Vu, Vv, and Vw appearing at the other ends of the windings M1, M2, and M3 in the state where the nodes in the first inverter 120 are caused to function as the neutral points of the motor 200 by applying the third failure diagnosis to the second inverter 130.

When at least one of the on or off failure of the SW and the disconnection failure of the winding is detected in the first to third failure diagnosis, the controller 340 can switch the motor energization control from the three-phase energization control to the two-phase energization control.

Figure 5:
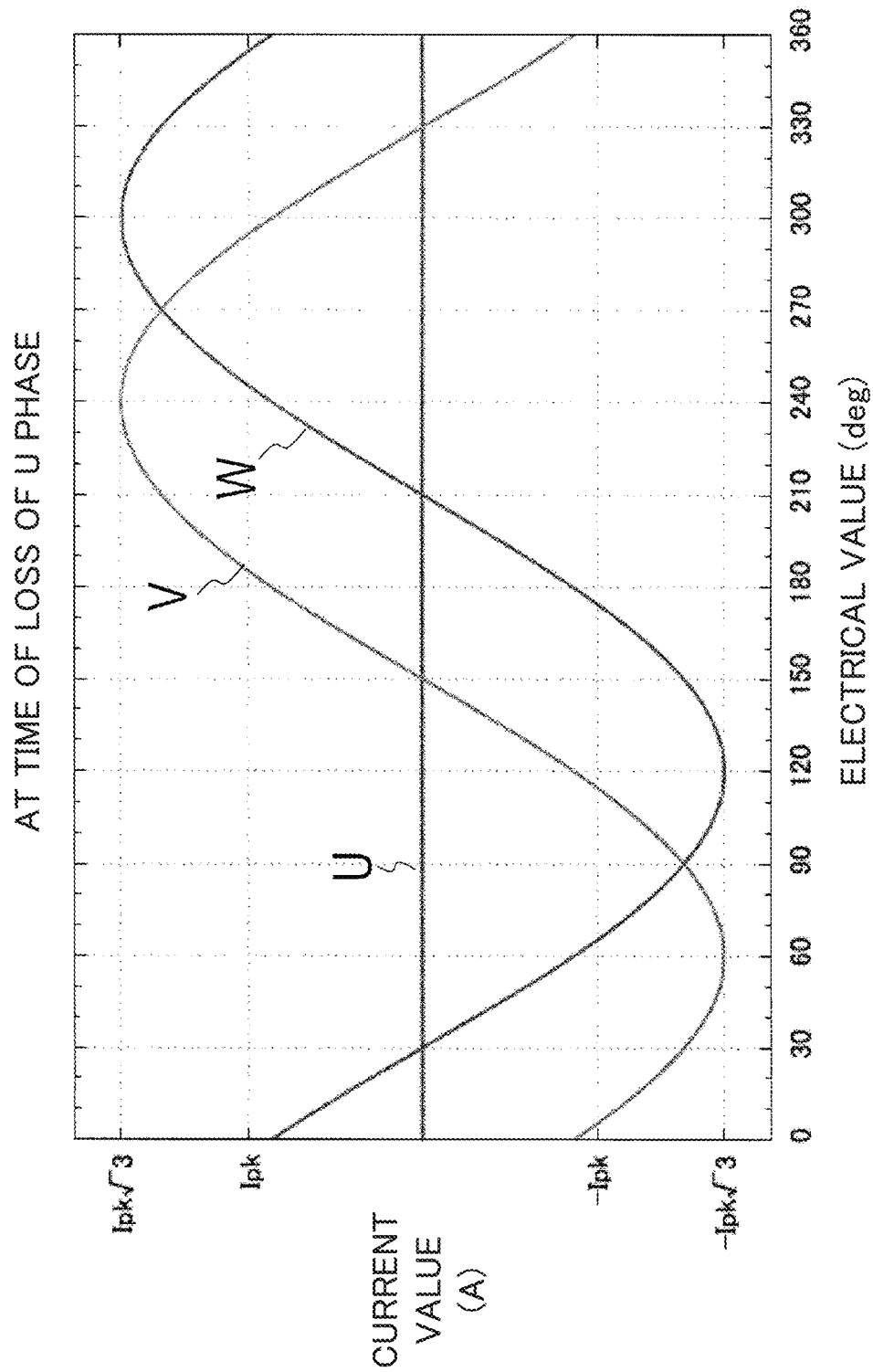
FIG. 5 is a graph illustrating a current waveform obtained by plotting current values flowing through the V-phase and W-phase windings of the motor 200 when the power conversion device 1000 is controlled according to two-phase energization control in a case where a winding M1 is disconnected.
Figure 6:
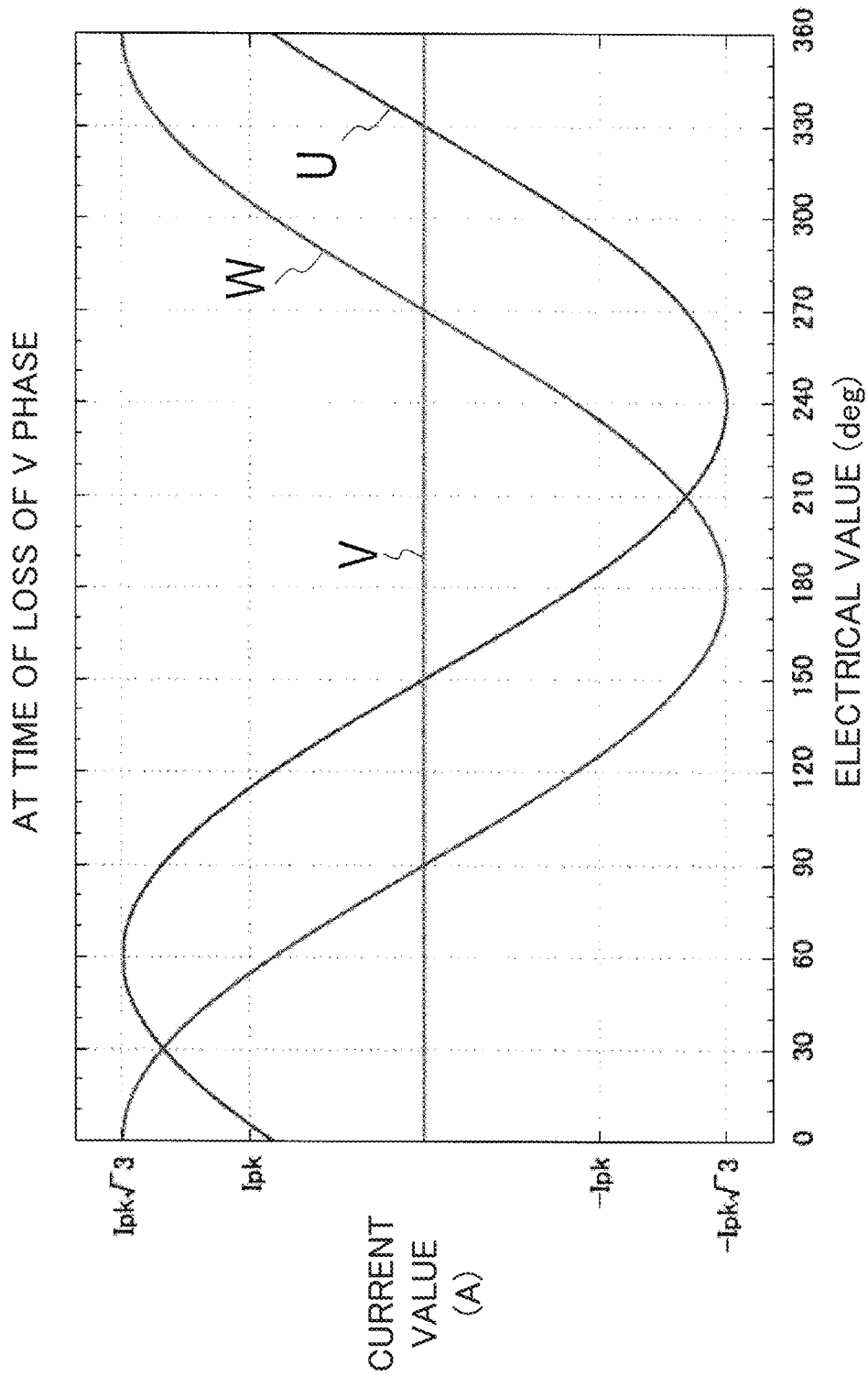
FIG. 6 is a graph illustrating a current waveform obtained by plotting current values flowing through the U-phase and W-phase windings of the motor 200 when the power conversion device 1000 is controlled according to two-phase energization control in a case where a winding M2 is disconnected.
Figure 7:
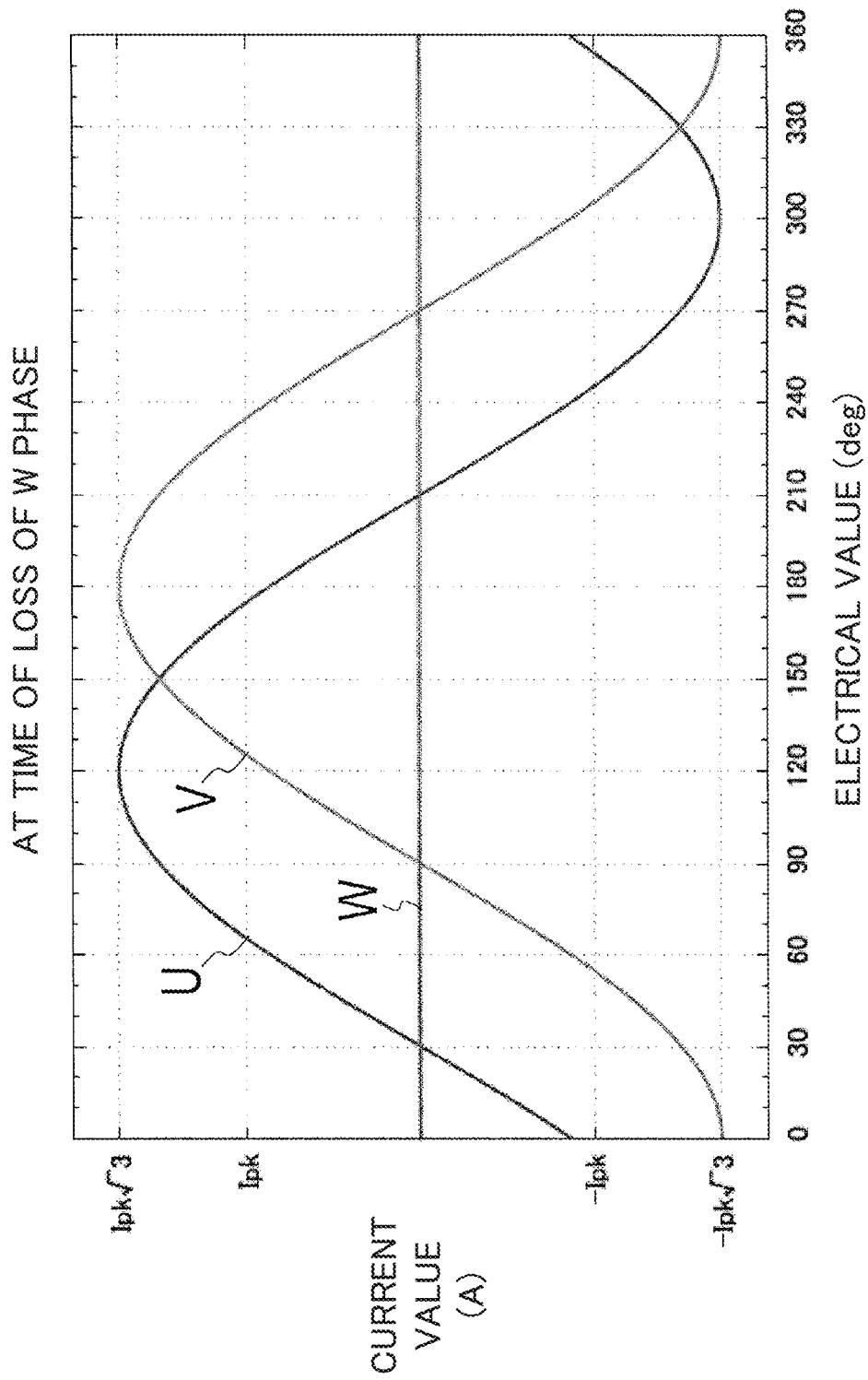
FIG. 7 is a graph illustrating a current waveform obtained by plotting current values flowing through the U-phase and V-phase windings of the motor 200 when the power conversion device 1000 is controlled according to two-phase energization control in a case where a winding M3 is disconnected.

FIG. 5 illustrates a current waveform obtained by plotting current values flowing through the V-phase and W-phase windings of the motor 200 when the power conversion device 1000 is controlled according to the two-phase energization control in the case where the winding M1 is disconnected. FIG. 6 illustrates a current waveform obtained by plotting current values flowing through the U-phase and W-phase windings of the motor 200 when the power conversion device 1000 is controlled according to the two-phase energization control in the case where the winding M2 is disconnected. FIG. 7 illustrates a current waveform obtained by plotting current values flowing through the U-phase and V-phase windings of the motor 200 when the power conversion device 1000 is controlled according to the two-phase energization control in the case where the winding M3 is disconnected. The horizontal axis indicates a motor electrical angle (deg), and the vertical axis indicates a current value (A). In the current waveforms of FIGS. 5 to 7, the current value is plotted every electrical angle of 30°. $I_{pk}$ represents the maximum current value (peak current value) of each phase.

For example, when the controller 340 identifies the on failure of the SW 121L of the first inverter 120 or the disconnection failure of the winding M1, it is difficult to use a U-phase H bridge. Therefore, the controller 340 can perform the two-phase energization control using V-phase and W-phase H bridges other than the U-phase H bridge.

The power conversion device 1000 including the U-phase, V-phase, and W-phase H bridges has a plurality of energization paths, and there is a degree of freedom in the selection. Therefore, if it is possible to identify an SW having an on or off failure or a disconnected winding, it is possible to select an available energization path and continue motor driving. According to the failure diagnosis technique of the present example embodiment, it is possible to identify the SW having the on or off failure or the disconnected winding. The controller 340 can select an appropriate energization path based on the diagnosis result.

According to the present example embodiment, various types of failure diagnosis require the phase voltage and does not require the current value. Therefore, it is possible to execute the failure diagnosis (specifically, failure detection and failure point identification) in a shorter time as compared with the conventional failure diagnosis based on the current value and the voltage value.

The power conversion device 1000 according to the present example embodiment is a single inverter device including an inverter unit 100A that includes the first inverter 120 and does not include the second inverter 130. Hereinafter, differences from the power conversion device 1000 according to the first example embodiment will be mainly described.

Figure 8:
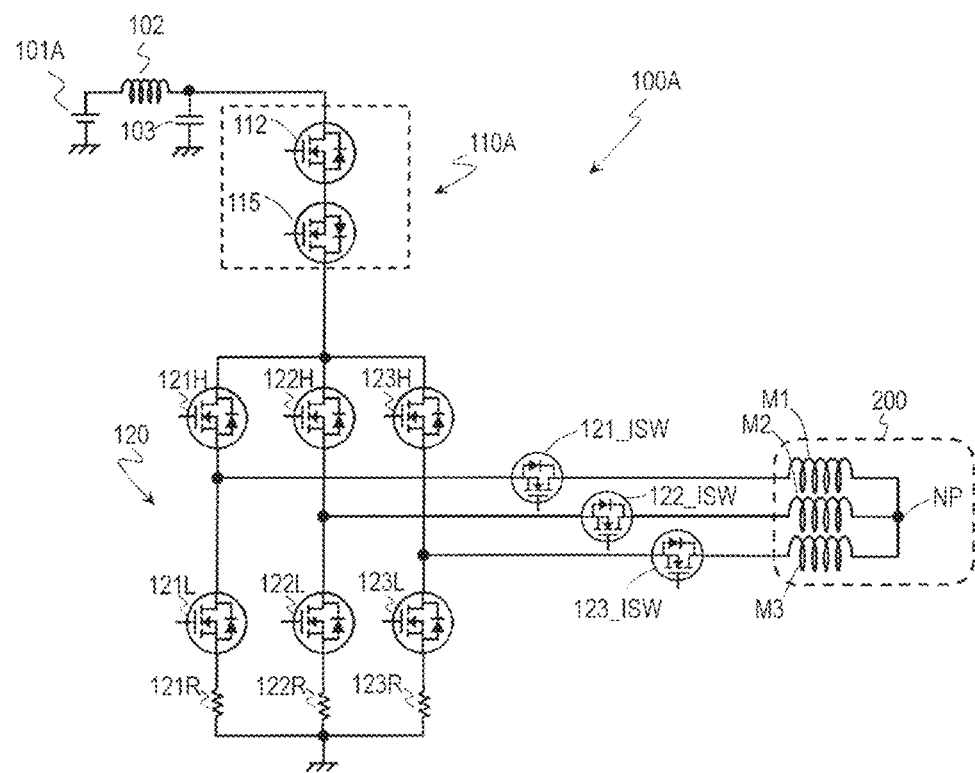
FIG. 8 is a circuit diagram illustrating a circuit configuration of an inverter unit 100A according to a second example embodiment of the present disclosure.

FIG. 8 schematically illustrates a circuit configuration of the inverter unit 100A according to the present example embodiment.

Other ends of the windings M1, M2, and M3 of the motor 200 are Y-connected. A node NP connecting the other ends of the windings M1, M2, and M3 functions as a neutral point of the motor.

The inverter unit 100A includes a power cutoff circuit 110A, the first inverter 120, and three phase separation relays 121_ISW, 122_ISW, and 123_ISW.

The power cutoff circuit 110A has the second and fifth switching elements 112 and 115.

The phase separation relay 121_ISW is connected between one end of the winding M1 and the U-phase leg of the first inverter 120, and switches connection/disconnection between the one end of the winding M1 and the U-phase leg. The phase separation relay 122_ISW is connected between one end of the winding M2 and the V-phase leg of the first inverter 120, and switches connection/disconnection between the one end of the winding M2 and the V-phase leg. The phase separation relay 123_ISW is connected between one end of the winding M3 and the W-phase leg of the first inverter 120, and switches connection/disconnection between the one end of the winding M3 and the W-phase leg.

For example, a semiconductor switch such as a MOSFET can be used as the phase separation relay. Other semiconductor switches such as a thyristor and an analog switch IC, or a mechanical relay may be used. In addition, a combination of an IGBT and a diode can be used. A control signal to turn on and off the phase separation relay may be generated by the drive circuit 350 under the control of the controller 340, for example.

Since the phase separation relay is provided, it is possible to suppress the influence of a back electromotive force of the motor that may be caused by a component failure, for example, when failure diagnosis is performed during the rotation of the motor. In addition, assuming that the power conversion device 1000 according to the present example embodiment is mounted on an electric power steering device to be described later, there is a possibility that the motor functions as an electric brake and the steering is locked if a short-circuit failure between phases of windings occurs. Such lock can be prevented by providing the phase separation relay.

The control circuit 300 can perform three-phase energization control by performing PWM control on a switching element of the first inverter 120, for example, in a state where the SW 112 is turned on, and the three phase separation relays 121_ISW, 122_ISW, and 123_ISW are turned on in the normal control.

When the controller 340 detects an on or off failure of a SW or a disconnection failure of a winding, for example, the motor control is shut down. This is because it is difficult to continue the motor driving by the two-phase energization control if a leg of one phase among the three phases fails or a winding is disconnected, which is different from the first example embodiment.

The controller 340 can identify the SW with the on or off failure from among the six SWs of the first inverter 120. The SW failure diagnosis has a first failure diagnosis to diagnose the on failure of the SW and a second failure diagnosis to diagnose the off failure of the SW, which is similar to the first example embodiment. The controller 340 performs the first and second failure diagnoses according to the above-described diagnosis procedure.

The controller 340 provides a control signal to turn off the phase separation relays 121_ISW, 122_ISW, and 123_ISW in the first failure diagnosis. The controller 340 executes the first failure diagnosis in the state where the phase separation relays 121_ISW, 122_ISW, and 123_ISW are turned off. In the above-described Step (2) of the first failure diagnosis, for example, the controller 340 measures a node potential between the high-side switching element and the low-side switching element in each phase leg (or a node potential between the leg and the phase separation relay) to acquire the three-phase voltages Vu, Vv and Vw.

FIG. 9 illustrates a specific example of an LUT that associates various failure patterns with three-phase voltage levels.

The LUT has failure diagnosis information illustrated in FIG. 9, for example, which associates the patterns of on failures of the SWs with the three-phase voltage levels Vu, Vv and Vw. The patterns of on failures of the SWs are the same as those described in the first example embodiment.

The controller 340 executes the first failure diagnosis and then executes the second failure diagnosis, which is similar to the first example embodiment. The controller 340 provides a control signal to turn off the phase separation relays 121_ISW, 122_ISW, and 123_ISW in the second failure diagnosis. The controller 340 executes the second failure diagnosis in the state where the phase separation relays 121_ISW, 122_ISW, and 123_ISW are turned off. The patterns of off failures of the SWs are the same as those described in the first example embodiment.

When the diagnosis of the on or off failure of the SW is completed, the controller 340 diagnoses the winding disconnection failure. The completion of the diagnosis of the on/off failure of the SW is a precondition for the diagnosis of the winding disconnection failure.

In the present example embodiment, the node NP of the winding functions as the neutral point of the motor 200 as described above. The controller 340 uses the node NP of the winding, that is, the neutral point of the motor 200, to execute the third failure diagnosis according to the above-described diagnosis procedure. The controller 340 executes the third failure diagnosis in the state where the phase separation relays 121_ISW, 122_ISW, and 123_ISW are turned on.

There is a case where it is difficult to detect the off failure of the phase separation relay only by a sequence of the winding disconnection failure diagnosis in the single inverter device. Therefore, it is preferable to additionally perform a sequence of the diagnosis of the off failure of the phase separation relay as will be described hereinafter.

When completing the diagnosis of the winding disconnection failure, the controller 340 can further diagnose the off failure of the phase separation relay. Specifically, the controller 340 can identify the phase separation relay with the off failure from among the phase separation relays 121_ISW, 122_ISW, and 123_ISW. The completion of the diagnosis of the winding disconnection failure is a precondition for the diagnosis of the off failure of the phase separation relay.

The diagnosis of the off failure of the phase separation relay has a fourth failure diagnosis. The controller 340 performs the fourth failure diagnosis by turning on or off the switching elements of the first inverter 120 in a predetermined pattern using the neutral point of the motor 200.

The fourth failure diagnosis includes the following steps.

(1) The controller 340 generates a control signal to turn on one high-side switching element of a second specific phase among the high-side switching elements 121H, 122H, and 123H in the first inverter 120, turn off the remaining two high-side switching elements, turn off all the low-side switching elements 121L, 122L, and 123L, and turn on the power cutoff circuit 110A. The controller 340 further generates a control signal to turn on the phase separation relays 121_ISW, 122_ISW, and 123_ISW. The phase separation relays 121_ISW, 122_ISW and 123_ISW are connected to a common control signal line and can be controlled by a common control signal. The second specific phase may be any one of the U, V, and W phases similarly to the first specific phase. However, the second specific phase is the same phase as the first specific phase.

(2) The drive circuit 350 gives the control signal to the low-side switching elements 121L, 122L, and 123L, the high-side switching elements 121H, 122H, and 123H, the phase separation relays 121_ISW, 122_ISW, and 123_ISW, and the SW 112 of the power cutoff circuit 110A in a state where the neutral point of the motor 200 is configured. The controller 340 measures the three-phase voltages Vu, Vv and Vw. For example, the controller 340 measures the node potentials between the high-side switching elements and the low-side switching elements in the respective phase legs, respectively, to acquire the three-phase voltages Vu, Vv and Vw. In the fourth failure diagnosis, the three-phase voltages Vu, Vv, and Vw change depending on the patterns of off failures of the phase separation relays.

(3) The controller 340 refers to the LUT that further associates the patterns of off failures of the phase separation relays with the n-phase voltage levels, and diagnoses the off failures of two phase separation relays other than the second specific phase among the phase separation relays 121_ISW, 122_ISW, and 123_ISW based on the measured three-phase voltages.

FIG. 9 will be referred to again.

The LUT further includes failure diagnosis information which associates the patterns of off failures of the phase separation relays with the levels of the three-phase voltages Vu, Vv, and Vw. There are mainly three patterns as the patterns of off failures of the phase separation relays: an off failure of the U-phase phase separation relay 121_ISW, an off failure of the V-phase phase separation relay 122_ISW, and an off failure of the W-phase phase separation relay 123_ISW.

The controller 340 uses the winding node NP to execute the fourth failure diagnosis. The controller 340 generates a control signal to turn on the SW 112 of the power cutoff circuit 110 and turn on the phase separation relays 121_ISW, 122_ISW, and 123_ISW. The control signal is given from the drive circuit 350 to the SW 112 and the phase separation relays 121_ISW, 122_ISW, and 123_ISW so that these SWs are all turned on.

The controller 340 generates a control signal to turn off the low-side SW 121L, 122L, and 123L of the first inverter 120. In the present example embodiment, the first and second specific phases are the U phase. However, the second specific phase may be different from the first specific phase. The controller 340 further turns on the high-side SW 121H of the U phase of the first inverter 120, and turns off the SWs 122H and 123H of the remaining two phases. A gate control signal is given from the drive circuit 350 to the SW 121H to turn on the SW 121H, and a gate control signal is given to the SWs 122H, 123H, 121L, 122L, and 123L to turn off them.

When each of the measured three-phase voltages Vu, Vv, and Vw indicates a high level, the controller 340 determines that the phase separation relays 121_ISW, 122_ISW, and 123_ISW have no off failure. When the SW 121H of the U phase, which is the second specific phase, is turned on, a high-level voltage appears at a node between the high-side switching element and the low-side switching element in the V-phase leg via the winding M2 and the phase separation relay 122_ISW. Further, the high-level voltage appears at a node between the high-side switching element and the low-side switching element in the W-phase leg via the winding M3 and the phase separation relay 123_ISW.

When a phase voltage of one phase among phases other than the second specific phase indicates the intermediate level and phase voltages of the remaining two phases indicate the high level, the controller 340 detects an off failure of a phase separation relay corresponding to a phase whose phase voltage indicates the intermediate level. Specifically, when phase voltages of the U and W phases indicate the high level and a phase voltage of the V phase indicates the intermediate level, the controller 340 can detect the off failure of the V-phase phase separation relay 122_ISW. This is because the high-level voltage does not appear at the node between the high-side switching element and the low-side switching element in the V-phase leg via the winding M2 and the phase separation relay 122_ISW even if the SW 121H is on when the phase separation relay 122_ISW has the off failure.

The off failure of the phase separation relay of the second specific phase can be detected in the above-described winding disconnection failure diagnosis, that is, the third failure diagnosis. When the specific phase in the third failure diagnosis is, for example, the U phase, the intermediate level confirmed as the phase voltages Vv and Vw of the V and W phases indicate a possibility of the disconnection failure of the U-phase winding M1 or the off failure of the U-phase phase separation relay 121_ISW. This is because it is difficult to distinguish between the winding failure in the specific phase and the off failure of the phase separation relay. In this manner, the controller 340 can detect the possibility of the off failure of the phase separation relay of the specific phase in the third failure diagnosis.

According to the present example embodiment, it is possible to identify at least one of the SW with the on or off failure, the disconnected winding, and the phase separation relay with the off failure in the single inverter device. The controller 340 can shut down the motor control when detecting any of the above failures. Alternatively, the three-phase energization control can be performed using three-phase legs other than a failed phase if it is possible to identify the failed phase in a single inverter device having four-phase legs that supplies power to a four-phase motor, for example.

Figure 10:
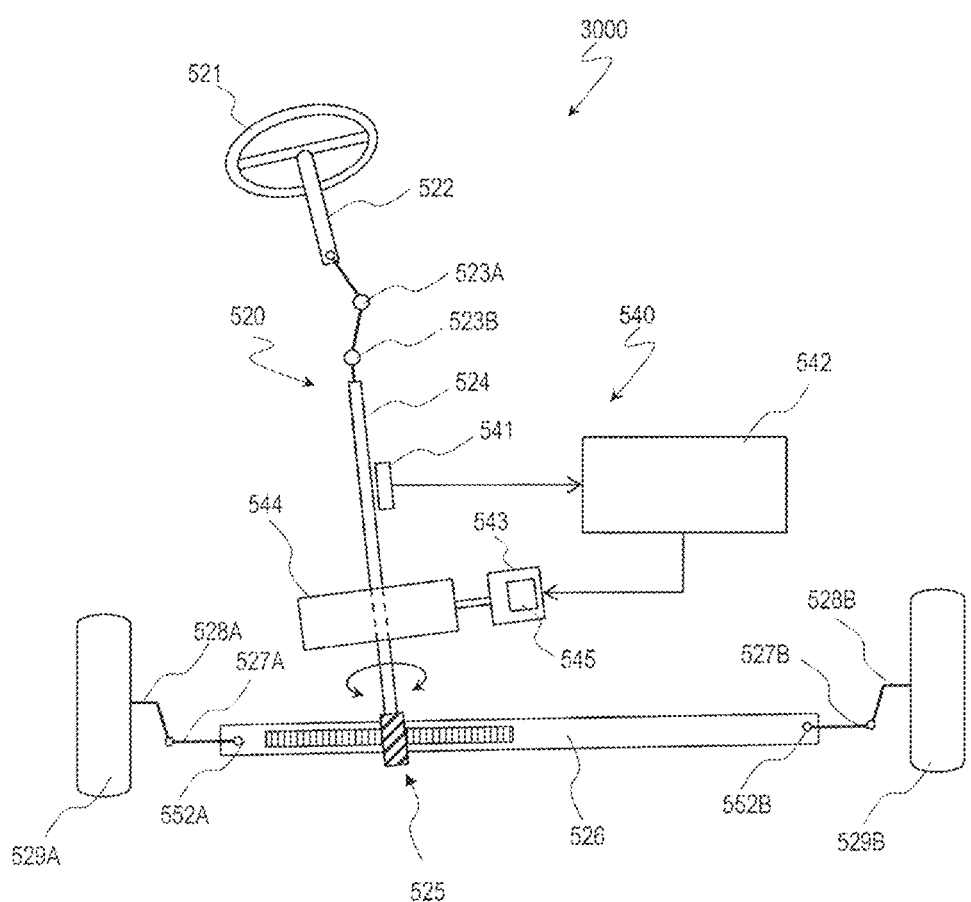
FIG. 10 is a schematic diagram illustrating a typical configuration of an electric power steering device 3000 according to third example embodiment of the present disclosure.

FIG. 10 schematically illustrates a typical configuration of an electric power steering device 3000 according to the present example embodiment.

A vehicle such as an automobile generally has an electric power steering (EPS) device. The electric power steering device 3000 according to the present example embodiment includes a steering system 520 and an auxiliary torque mechanism 540 that generates an auxiliary torque. The electric power steering device 3000 generates the auxiliary torque which assists a steering torque of the steering system that is generated when a driver operates the steering wheel. The operational burden of the driver is reduced by the auxiliary torque.

The steering system 520 includes, for example, a steering handle 521, a steering shaft 522, universal shaft joints 523A and 523B, a rotating shaft 524, a rack and pinion mechanism 525, a rack shaft 526, left and right ball joints 552A and 552B, tie rods 527A and 527B, knuckles 528A and 528B, and left and right steering wheels 529A and 529B.

The auxiliary torque mechanism 540 includes, for example, a steering torque sensor 541, an automotive electronic control unit (ECU) 542, a motor 543, and a speed reduction mechanism 544. The steering torque sensor 541 detects the steering torque in the steering system 520. The ECU 542 generates a drive signal based on a detection signal of the steering torque sensor 541. The motor 543 generates the auxiliary torque corresponding to the steering torque based on the drive signal. The motor 543 transmits the generated auxiliary torque to the steering system 520 via the speed reduction mechanism 544.

The ECU 542 includes, for example, the controller 340 and the drive circuit 350 according to the first example embodiment. In an automobile, an electronic control system using the ECU as the core is constructed. In the electric power steering device 3000, for example, a motor drive unit is constructed by the ECU 542, the motor 543, and the inverter 545. The motor module 2000 according to the first or second example embodiment can be suitably used for the unit.

Example embodiments of the present disclosure can be widely used in various devices including various motors such as a vacuum cleaner, a dryer, a ceiling fan, a washing machine, a refrigerator, and an electric power steering device.

Features of the above-described example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

The invention claimed is:

1. A power conversion device that converts power from a power supply into power to be supplied to a motor including n-phase windings, where n is an integer of three or more, the power conversion device comprising:
   a first inverter connected to first ends of the respective phase windings of the motor, the first inverter including n legs each of which includes a low-side switch and a high-side switch;
   a control circuit that controls an on/off operation of the n low-side switches and the n high-side switches in the first inverter, and diagnoses on failures of the n low-side switches and the n high-side switches; and
   a power cutoff circuit that switches connection/disconnection between power supply and the first inverter; wherein
   the control circuit:
      generates a control signal to turn off all the n low-side switches and the n high-side switches;
      supplies the control signal to the n low-side switches and the n high-side switches and measures n-phase voltages that change depending on patterns of the on failures of the switches; and
      executes a first failure diagnosis to diagnose the on failures of the n low-side switches and the n high-side switches based on the measured n-phase voltages by referring to a table associating the patterns of the on failures of the switches with n-phase voltage levels; and
   the control circuit:
      turns on the power cutoff circuit when executing the first failure diagnosis;
      generates a control signal to turn on the n low-side switches and turn off the n high-side switches;
      supplies the control signal to the n low-side switches and the n high-side switches and measures the n-phase voltages that change depending on patterns of off failures of the low-side switches; and
      executes a second failure diagnosis to diagnose the off failures of the n low-side switches based on the measured n-phase voltages by referring to the table further associating the patterns of the off failures of the low-side switches with the n-phase voltage levels.

2. The power conversion device according to claim 1, wherein based on the table, the control circuit:
   determines that the n low-side switches and the n high-side switches have no on failure when each of the n-phase voltages indicates a second level;
   detects an on failure of a low-side switch in a leg of one phase when a phase voltage of the one phase among the n-phase voltages indicates a first level; and
   detects an on failure of a high-side switch in a leg of one phase when a phase voltage of the one phase among the n-phase voltages indicates a third level; and
   the first level is higher than a ground level, the second level is higher than the first level, and the third level is higher than the second level and lower than a voltage level of the power supply.

3. The power conversion device according to claim 1, wherein based on the table, the control circuit determines that the n low-side switches have no off failure when each of the n-phase voltages indicates the first level, and an off failure of a low-side switch in a leg of one phase when a phase voltage of the one phase among the n-phase voltages indicates the second level.

4. The power conversion device according to claim 3, wherein the control circuit:
   generates a control signal to turn off the n low-side switches and turn on the n high-side switches;
   supplies the control signal to the n low-side switches and the n high-side switches and measures the n-phase voltages that change depending on patterns of off failures of the high-side switches; and
   executes the second failure diagnosis to further diagnose the off failures of the n high-side switches based on the measured n-phase voltages by referring to the table further associating the patterns of the off failures of the high-side switches with the n-phase voltage levels.

5. The power conversion device according to claim 4, wherein based on the table, the control circuit determines that the n high-side switches have no off failure when each of the n-phase voltages indicates the third level, and an off failure of a high-side switch in a leg of one phase when a phase voltage of the one phase among the n-phase voltages indicates the second level.

6. The power conversion device according to claim 1, further comprising n-phase separation relays that switch connection/disconnection between the n legs of the first inverter and the one ends of the windings; wherein
   second ends of the respective phase windings of the motor are Y-connected; and
   the control circuit executes at least one of the first and second failure diagnoses in a state where the n phase separation relays are turned off.

7. The power conversion device according to claim 1, further comprising a second inverter connected to second ends of the respective phase windings of the motor, the second inverter including n legs each of which includes a low-side switch and a high-side switch.

8. The power conversion device according to claim 7, wherein the power cutoff circuit includes:
   a first switch that switches connection/disconnection between the first inverter and ground;
   a second switch that switches connection/disconnection between the first inverter and the power supply;
   a third switch that switches connection/disconnection between the second inverter and the ground; and
   a fourth switch that switches connection/disconnection between the second inverter and the power supply.

9. The power conversion device according to claim 8, wherein the control circuit executes at least one of the first and second failure diagnoses on the first inverter in a state where the first and second switches are turned on, the third and fourth switches are turned off, and all of the switches of the second inverter are turned off.

10. The power conversion device according to claim 8, wherein the control circuit executes at least one of the first and second failure diagnoses on the second inverter in a state where the first and second switches are turned off, the third and fourth switches are turned on, and all of the switches of the first inverter are turned off.

11. A motor module comprising:
   a motor; and
   the power conversion device according to claim 1.

12. An electric power steering device comprising the motor module according to claim 11.

* * * * *